United States Patent
Ludwig et al.

(10) Patent No.: US 9,851,370 B2
(45) Date of Patent: Dec. 26, 2017

(54) SYSTEM INCLUDING A SENSOR AND AN ELECTRICAL CABLE

(71) Applicant: Robert Bosch GmbH, Stuttgart (DE)

(72) Inventors: Matthias Ludwig, Moessingen (DE); Juergen Kurle, Reutlingen (DE); Conrad Haeussermann, Trochtelfingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 156 days.

(21) Appl. No.: 14/930,331

(22) Filed: Nov. 2, 2015

(65) Prior Publication Data

US 2016/0139167 A1    May 19, 2016

(30) Foreign Application Priority Data

Nov. 17, 2014   (DE) ......................... 10 2014 223 356

(51) Int. Cl.
| | |
|---|---|
| *G01P 1/02* | (2006.01) |
| *H01B 7/02* | (2006.01) |
| *H01R 4/02* | (2006.01) |
| *H05K 9/00* | (2006.01) |
| *H01R 12/67* | (2011.01) |
| *H01R 13/66* | (2006.01) |

(52) U.S. Cl.
CPC ................ *G01P 1/02* (2013.01); *G01P 1/023* (2013.01); *H01B 7/0275* (2013.01); *H01R 4/02* (2013.01); *H01R 12/67* (2013.01); *H01R 13/6683* (2013.01); *H05K 9/00* (2013.01)

(58) Field of Classification Search
CPC .......... G01P 1/02; G01P 1/023; H01R 12/67; H01R 13/6683; H01R 4/02; H05K 9/00; H01B 7/0275; H01B 7/1845; H01B 7/08
USPC .......................................................... 73/493
See application file for complete search history.

(56) References Cited

U.S. PATENT DOCUMENTS

| | | | | |
|---|---|---|---|---|
| 8,797,714 B2* | 8/2014 | Balji | .................... | A61B 5/0002 361/437 |
| 2014/0073189 A1* | 3/2014 | Kondou | ............. | H01R 13/6683 439/620.21 |

* cited by examiner

*Primary Examiner* — Walter L Lindsay, Jr.
*Assistant Examiner* — Ruth Labombard
(74) *Attorney, Agent, or Firm* — Norton Rose Fulbright US LLP; Gerard Messina

(57) ABSTRACT

A system including a sensor and an electrical cable including electrical conductors, which are provided with an electrically insulating sheathing, the sensor being accommodated in a housing, the conductors of the cable are exposed from the sheathing at certain locations and the housing is fastened in an integrally bonded or form-fitting manner on the conductors of the cable at the exposed locations in the sheathing, and an electrically insulating sheathing is provided, which encloses the housing in a form-fitting manner and covers at least the cable in the area of the housing.

14 Claims, 5 Drawing Sheets

SYSTEM INCLUDING A SENSOR AND AN ELECTRICAL CABLE

RELATED APPLICATION INFORMATION

The present application claims priority to and the benefit of German patent application no. 10 2014 223 356.9, which was filed in Germany on Nov. 17, 2014, the disclosure of which is incorporated herein by reference.

FIELD OF THE INVENTION

The present invention is directed to a system for mechanically connecting and electrically contacting a sensor to an electrical cable.

BACKGROUND INFORMATION

The related art describes electronic components having a low number of poles, such as inertial sensors for safety systems, such as ABS or ESP, which are mounted manually by the vehicle manufacturer during final assembly or, alternatively, by the supplier following installation of the cable harness. Assembly usually involves a screw connection of the sensor directly onto the vehicle body or, alternatively, using a preassembly group. The electrical contacting of the sensor is accomplished following its mechanical fixation via a plug system in another work step.

SUMMARY OF THE INVENTION

The object of the present invention is to simplify the production steps mentioned above and to permit a simple integration of the sensor into the electrical cables or the cable harness.

The present invention relates to a system including a sensor accommodated in a housing and an electrical cable. One advantage of the present invention is that the conductors of the cable are exposed at certain locations, and the housing including the sensor is fastened on the conductors of the cable in an integrally bonded and/or form-fitting manner at these exposed locations of the cable. Furthermore, an electrically insulating sheathing is provided, which encloses the housing in a form-fitting manner and covers the cable at least in the area of the housing.

Due to the integration of the sensor into the cable or cable harness, which is achieved in this way, the plug contacting clamp in the sensor housing and the mating plug housing in the cable harness may be omitted in an advantageous manner. The sensor may be placed at an arbitrary point on the cable or, alternatively, it may also be positioned as the termination of the electrical cable.

Additional advantageous embodiments and improvements of the system according to the present invention are stated in the subclaims.

In one specific embodiment, the sheathing encloses the cable in the area of the housing in a form-fitting manner, so that the cable is embedded in the sheathing.

The integrally bonded connection of the sensor to the cable may be accomplished by soldering, for example, by reflow soldering, a soft soldering method, such as that may be used for soldering so-called SMD (surface-mounted device) components.

An alternative form-fitting connection or integration of the sensor with the cable involves providing the conductor of the cable with contacts, which may be with so-called crimp contacts, into which the housing or the so-called package is inserted, mechanically secured and electrically contacted.

In one specific embodiment, the electrical contacts of the conductors are implemented as electromagnetic shielding at these connection points, so that effective EMC protection is implementable at the same time.

The housing of the sensor is provided with a sheathing, which may be made of a thermomechanically adapted thermosetting material. Thus, on the one hand, a permanently durable and thermally resistant and optionally tight sheathing is established. Furthermore, a complex thermoplastic extrusion may be omitted when using the thermosetting extrusion.

In one specific embodiment, straps provided with openings are formed simultaneously during the manufacture of the sheathing and are used to accommodate fastening elements. The latter may be configured as expanding rivets, for example, with the aid of which the housing including the sensor and the cable is fastened on the vehicle body.

DETAILED DESCRIPTION

Figure 1:
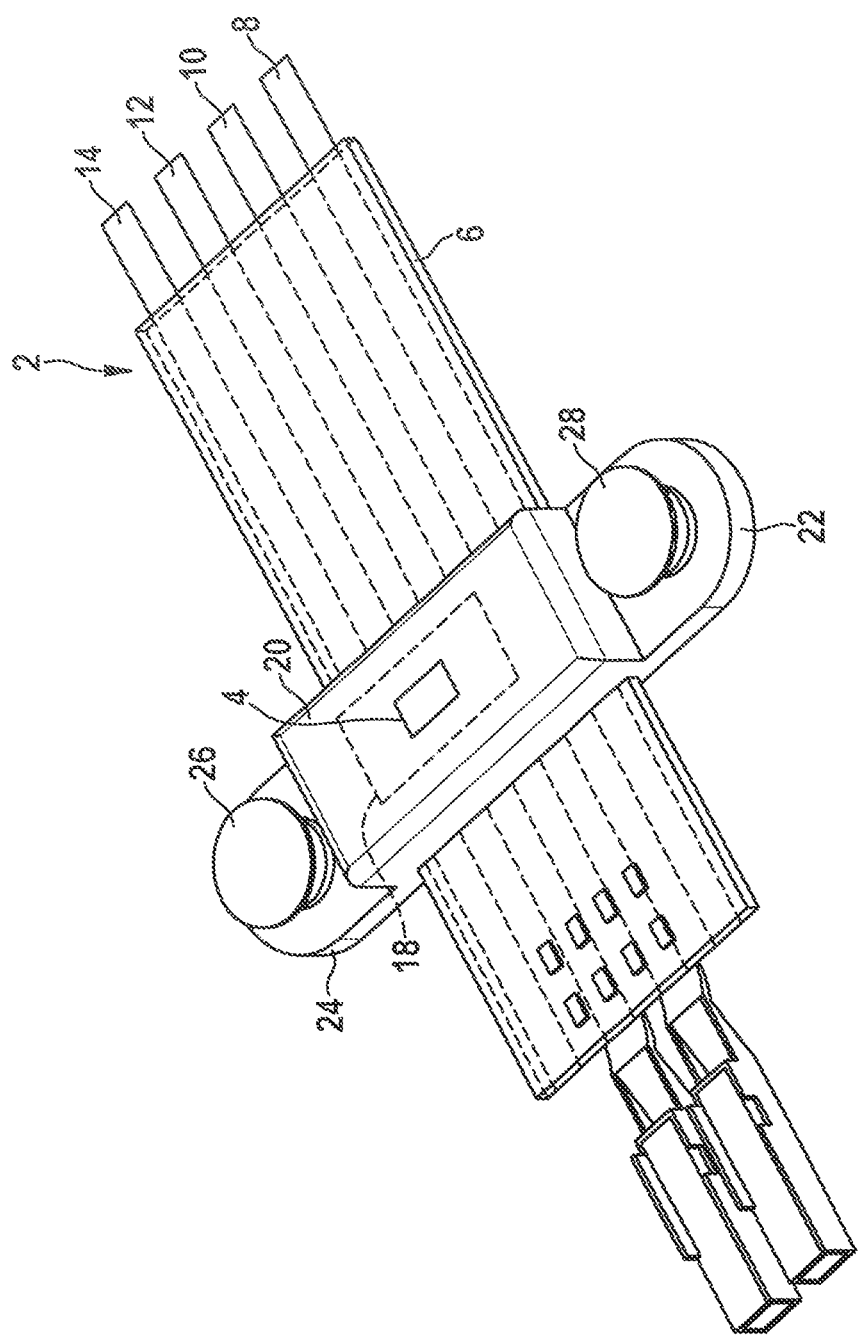
FIG. 1 shows the basic setup of the system according to the present invention in a first exemplary embodiment.
Figure 2:
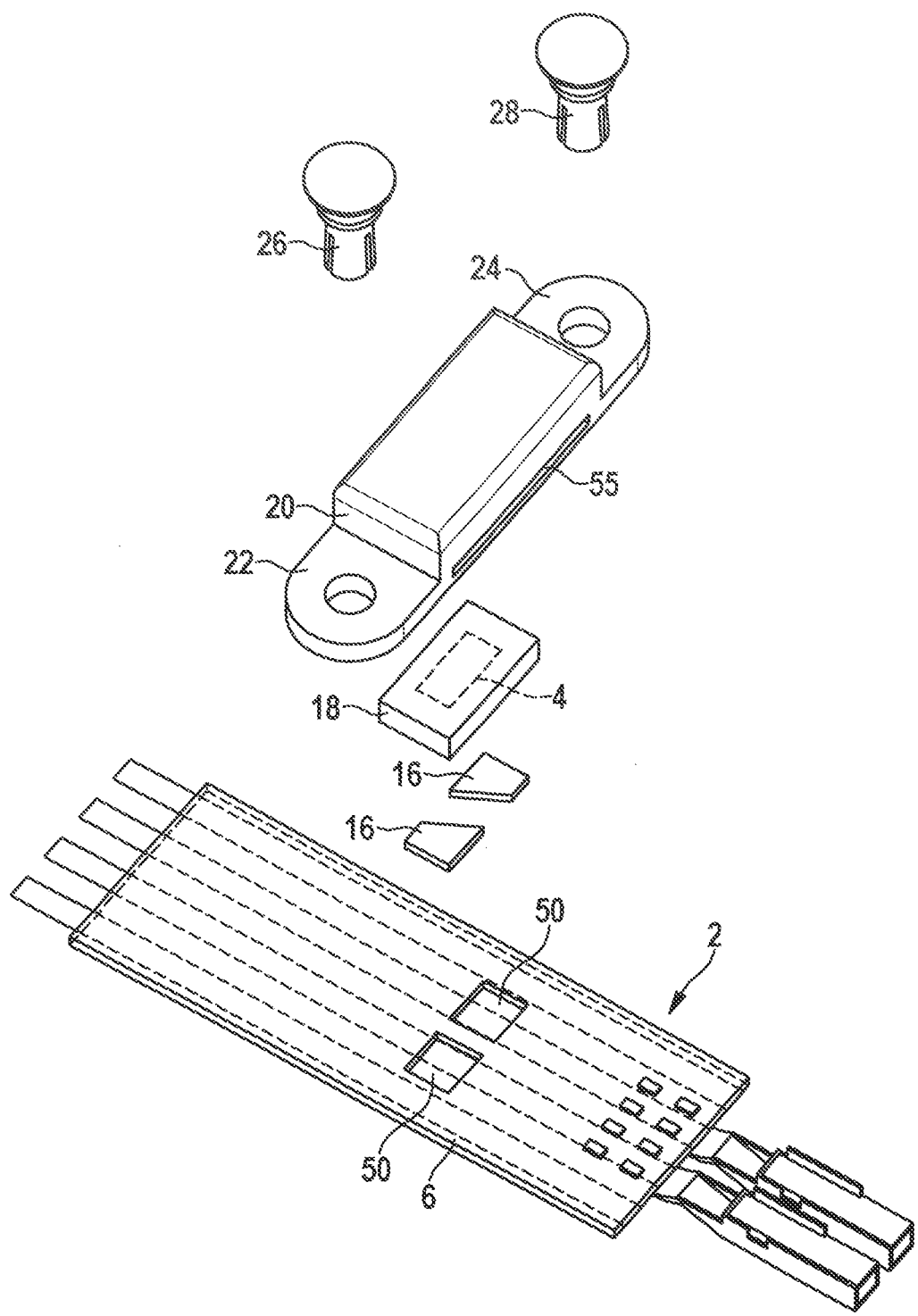
FIG. 2 shows an exploded view of the setup according to FIG. 1.

FIG. 1 schematically shows a sensor 4 connected mechanically and electrically to an electrical cable 2. Sensor 4 is embedded in a housing 18. Housing 18 is enclosed by a sheathing 20. FIG. 2 shows an exploded view of FIG. 1.

Cable 2, which is provided with an electrically insulating sheathing 6, includes four conductors 8, 10, 12, 14 in the present exemplary embodiment. Cable 2 may be part of a cable harness of a vehicle, for example. Two central conductors 10 and 12 are integrally bonded, both electrically and mechanically, to housing 18 of sensor 4 by a soft soldering method, for example, the reflow soldering mentioned above. For this purpose, soldering paste 16 is applied to conductor surfaces 50, which are open on the cable side, of the two central conductors 10, 12, and then sensor 4, which is integrated into housing 18, is connected to the two conductors 10, 12. This entire composite is in turn enclosed tightly with sheathing 20, which is manufactured by extrusion of cable 2 and housing 18, which may be done using a thermosetting material. Instead of the thermosetting material, other electrically insulating materials may also be used to manufacture sheathing 20. Sheathing 20 covers at least cable 2 in the area of housing 18, so that the space between housing 18 and the top side of cable 2 is sealed. In another specific embodiment, cable 2 including housing 18 and sensor 4 is embedded in sheathing 20. The top side of cable 2 and the bottom side of cable 2 are then both covered by sheathing 20 in the area of housing 18. Sheathing 20 may be configured in such a way that at least electrical contacts 51 and contacts 34, 36, and optionally housing 18 including sensor 4 and contacts 34, 36, are enclosed tightly.

Sensor 4 may additionally have an evaluation circuit, in particular an ASIC circuit, in housing 18. Furthermore, the housing including sensor 4 may be configured as an LGA sensor, electrical contacts 51 (FIG. 5) for electrical contacting of the sensor and the evaluation circuit being provided on the bottom side of housing 18. Housing 18 including sensor 4 and the evaluation circuit may thus form a sensor chip set.

Soldering pastes 16 may be provided in the form of soldering paste pads.

During the manufacture of sheathing 20 with the aid of a corresponding injection mold, straps 22 and 24, which are provided with corresponding openings for accommodating fastening elements 26 and 28 and are formed in one piece on sheathing 20, are also manufactured at the same time in the exemplary embodiment shown here. During fastening of cable 2 on the vehicle body, fastening elements 26, 28, which are configured as expanding rivets, engage in corresponding openings in the vehicle body.

Figure 3:
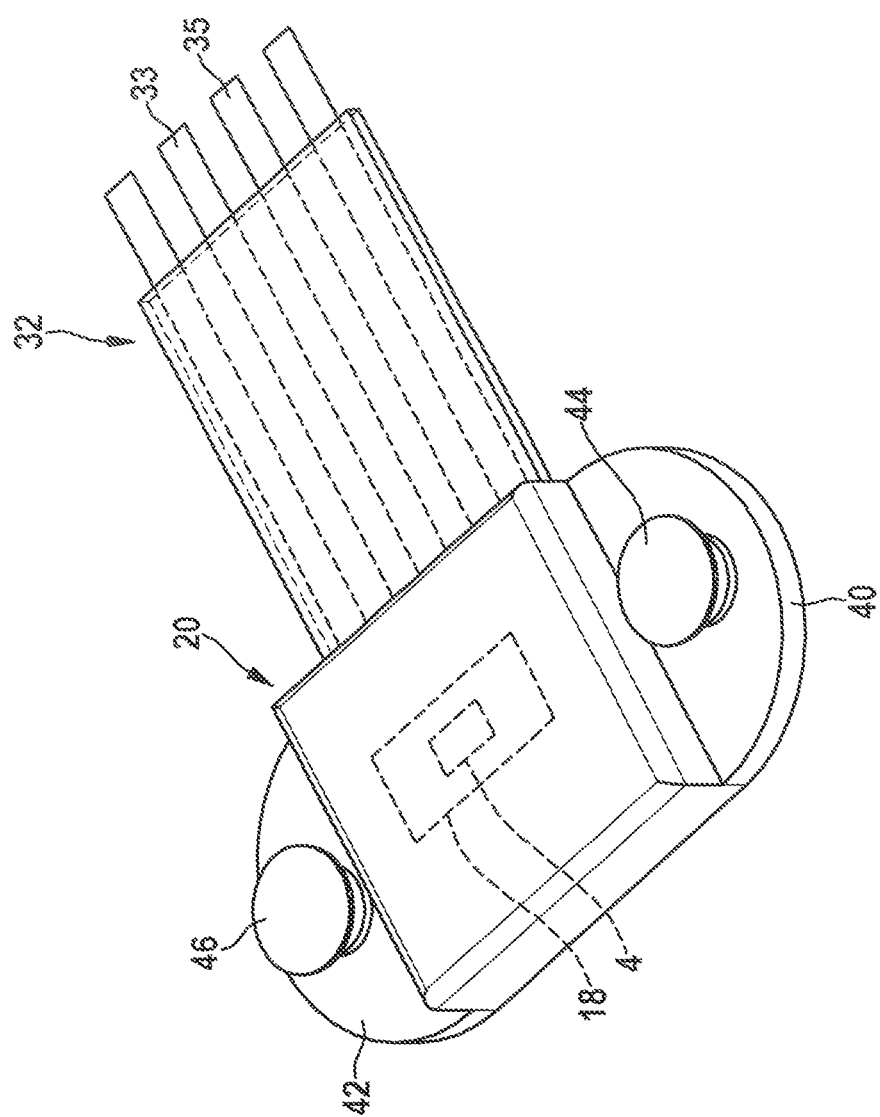
FIG. 3 shows the basic setup of the system according to the present invention in a second exemplary embodiment.
Figure 4:
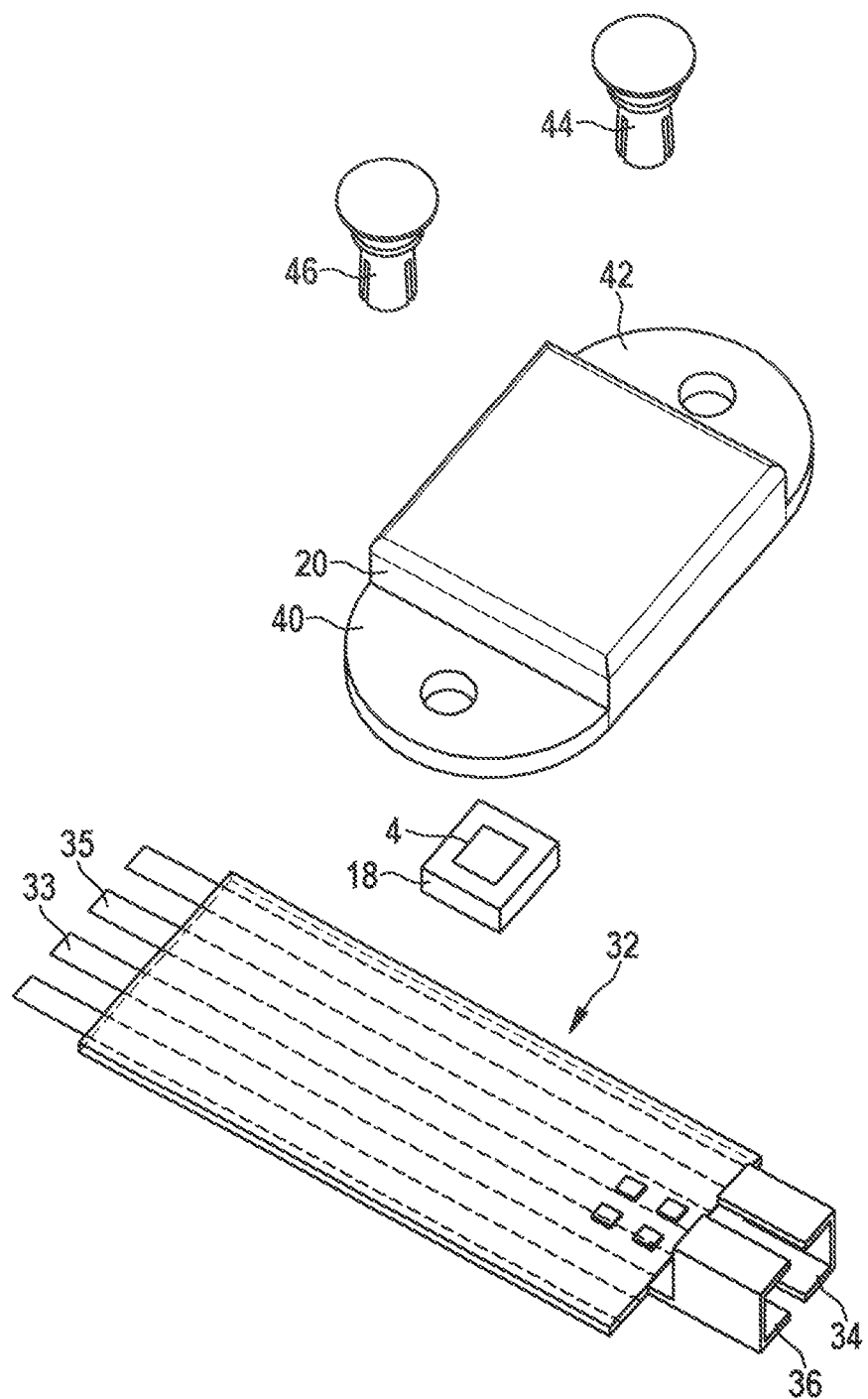
FIG. 4 shows an exploded view of the setup according to FIG. 3.

In a second exemplary embodiment, which is described below on the basis of FIGS. 3 and 4, a sensor 4, which is also integrated into a housing 18, is secured to an electrical cable 32, the two central electrical conductors 33 and 35 being provided with contacts 34, 36 on one end of the four-core cable 32 in this case, housing 18 of the sensor being inserted into these contacts, mechanically secured and electrically contacted. Contacts 34, 36 may be configured as crimp contacts.

Housing 18 is in turn provided with a sheathing 20, which may be manufactured by extrusion using a thermosetting material. Instead of the thermosetting material, other electrically insulating materials may also be used to manufacture sheathing 20. Sheathing 20 encloses cable 2 and housing 18 including sensor 4. Sheathing 20 may also enclose the top side and the bottom side of cable 2. Sheathing 20 in the exemplary embodiment shown here has two straps 40 and 42, which are manufactured together with sheathing 20 during injection molding. Straps 40, 42 have two openings, in which fastening elements in the form of two expanding rivets 44 and 46 are again accommodated, with the aid of which the sensor and cable 32 are fastened on the vehicle body. Sensor 4 may additionally have an evaluation circuit, in particular an ASIC circuit in housing 18. Furthermore, housing 18 including sensor 4 may be configured as an LGA sensor, whereby electrical contacts 51 (FIG. 5) for electrical contacting of the sensor and the evaluation circuit are provided on the bottom side of housing 18. Housing 18 including sensor 4 and the evaluation circuit may thus form a sensor chip set.

Figure 5:
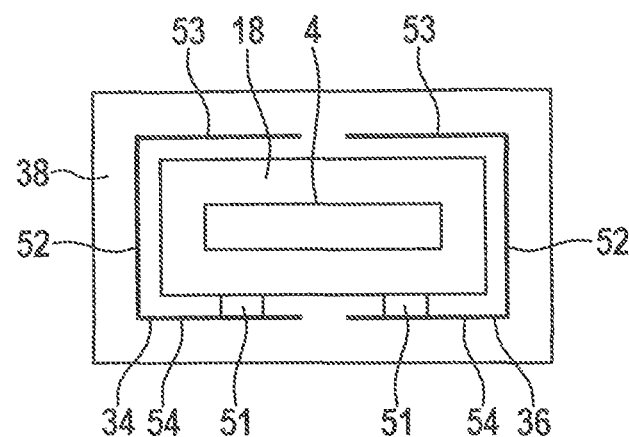
FIG. 5 shows a cross section through the contacts and the housing including the sensor from FIG. 3.

FIG. 5 shows a schematic cross section through housing 18 including sensor 4, whereby an evaluation circuit, in particular an ASIC circuit, may be provided in housing 18, depending on the specific embodiment selected. Housing 18 is mechanically secured by contacts 34, 36, and sensor 4 is electrically connected to contacts 34, 36 by electrical contacts 51, which are provided on the bottom side of housing 18. Furthermore, after assembly of housing 18, sheathing 20 may be extruded, using a thermosetting material. In the process, contacts 34, 36, and, optionally, housing 18 are enclosed tightly. Instead of a thermosetting material, other electrically insulating materials may also be used to manufacture sheathing 20.

Sheathing 20 may be formed in such a way that at least electrical contacts 51 and contacts 34, 36, and optionally housing 18 including sensor 4 and contacts 34, 36, 51 are enclosed tightly.

In the specific embodiment illustrated here, contacts 34, 36 each have a bottom wall 54, a side wall 52 and a top wall 53.

Side walls 52 are formed at a right angle to bottom wall 54 of conductors 33, 35. Top walls 53 are situated in parallel to bottom wall 54 of conductors 33, 35 and facing one another. However, there remains a distance between the two top walls 53 situated in one plane. Contacts 34, 36 including bottom walls, side walls 52 and top walls 53, form a receiving space for receiving housing 18. With the aid of the receiving space, housing 18 may be held mechanically before being extruded with sheathing 20 and electrical contacts 51 may be electrically contacted to bottom walls 54. Contacts 51 and contacts 34, 36 in particular are electrically insulated and may be sealed against moisture with the aid of sheathing 20. Contacts 34, 36 of the conductors may be configured as crimp contacts 34, 36, the crimp contacts being mechanically secured on and electrically contacted on the cable or corresponding conductors 33, 35 via a corresponding crimp assembly.

The receiving space also provides EMC protection since housing 18 and thus also sensor 4 and also optionally an evaluation circuit (ASIC), which is provided, are shielded over large areas by bottom walls 54, side walls 52 and top walls 53.

The sensor may be configured, for example, as a motion sensor, an acceleration sensor or an inertial sensor for measuring an acceleration and a rotation rate, e.g., for safety systems, such as ABS/ESP or airbag systems.

What is claimed is:

1. A system, comprising:
 a sensor, the sensor being accommodated in a housing;
 an electrical cable including electrical conductors, which are provided with a first electrically insulating sheathing, wherein the electrical conductors of the electrical cable are exposed from the first electrically insulating sheathing at certain locations, and wherein the housing is fastened on the electrical conductors of the electrical cable at the exposed locations in the first electrically insulating sheathing in an integrally bonded or form-fitting manner; and
 a second electrically insulating sheathing, which encloses the housing in a form-fitting manner and covers at least a portion of the electrical cable;
 wherein the electrical conductors of the electrical cable have contacts, the housing including the sensor being mechanically secured and electrically contacted by the contacts;
 wherein the contacts are configured as electromechanical shielding, so as to achieve EMC shielding of the sensor.

2. The system of claim 1, wherein the housing including the sensor is connected in an integrally bonded manner to the electrical conductors of the electrical cable by a solder connection.

3. The system of claim 1, wherein the electrical conductors of the electrical cable have contacts, the housing including the sensor being mechanically secured and electrically contacted by the contacts.

4. The system of claim 1, wherein the second electrically insulating sheathing is made of a thermomechanical thermosetting material.

5. The system of claim 4, wherein the second electrically insulating sheathing made of a thermomechanical thermosetting material is manufactured by injection molding.

6. The system of claim 4, wherein the second electrically insulating sheathing has openings for accommodating fastening elements.

7. The system of claim 1, wherein the housing including the sensor and the exposed locations on the electrical cable are enclosed by the second electrically insulating sheathing in a fluid-tight manner.

8. The system of claim 1, wherein the housing including the sensor is connected in an integrally bonded manner to the electrical conductors of the electrical cable by a solder connection by reflow soldering.

9. A system, comprising:
   a sensor, the sensor being accommodated in a housing;
   an electrical cable including electrical conductors, which are provided with a first electrically insulating sheathing, wherein the electrical conductors of the electrical cable are exposed from the first electrically insulating sheathing at certain locations, and wherein the housing is fastened on the electrical conductors of the electrical cable at the exposed locations in the first electrically insulating sheathing in an integrally bonded or form-fitting manner; and
   a second electrically insulating sheathing, which encloses the housing in a form-fitting manner and covers at least a portion of the electrical cable;
   wherein the second electrically insulating sheathing is made of a thermomechanical thermosetting material;
   wherein the second electrically insulating sheathing has openings for accommodating fastening elements;
   wherein the fastening elements are configured as expanding rivets.

10. The system of claim 9, wherein the housing including the sensor is connected in an integrally bonded manner to the electrical conductors of the electrical cable by a solder connection.

11. The system of claim 9, wherein the electrical conductors of the electrical cable have contacts, the housing including the sensor being mechanically secured and electrically contacted by the contacts.

12. The system of claim 9, wherein the housing including the sensor and the exposed locations on the electrical cable are enclosed by the second electrically insulating sheathing in a fluid-tight manner.

13. The system of claim 9, wherein the housing including the sensor is connected in an integrally bonded manner to the electrical conductors of the electrical cable by a solder connection by reflow soldering.

14. The system of claim 9, wherein the second electrically insulating sheathing made of the thermomechanical thermosetting material is manufactured by injection molding.

\* \* \* \* \*